United States Patent
Naritomi et al.

(10) Patent No.: US 8,117,524 B2
(45) Date of Patent: Feb. 14, 2012

(54) DATA RECOVERY CIRCUIT

(75) Inventors: Hiroshi Naritomi, Kasugai (JP); Hayato Isobe, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1007 days.

(21) Appl. No.: 12/047,856

(22) Filed: Mar. 13, 2008

(65) Prior Publication Data

US 2008/0229169 A1     Sep. 18, 2008

(30) Foreign Application Priority Data

Mar. 14, 2007 (JP) ................................. 2007-064876

(51) Int. Cl.
    *G06F 11/00* (2006.01)
(52) U.S. Cl. ......................................... 714/802; 714/52
(58) Field of Classification Search .................... 714/52, 714/752, 802, 805
    See application file for complete search history.

(56) References Cited

U.S. PATENT DOCUMENTS

2011/0107069 A1*   5/2011   Hansen et al. ................ 712/225

FOREIGN PATENT DOCUMENTS

JP       2000-132461 A      5/2000

* cited by examiner

*Primary Examiner* — Bryce Bonzo
(74) *Attorney, Agent, or Firm* — Arent Fox LLP

(57) ABSTRACT

A data recovery circuit for recovering data from a parity error without entirely rewriting the data. A write circuit is connected to memory regions including an actual data region and a copy region. A first parity generation circuit writes actual data with even parity to the actual data region. A second parity generation circuit writes backup data of the actual data with odd parity to the copy region. A read circuit reads data from the actual data region and the copy region. An even parity checker detects a parity error in the actual data based on the data read from the actual data region. An odd parity checker checks whether the data read from the copy region is backup data.

16 Claims, 8 Drawing Sheets

DATA RECOVERY CIRCUIT

CROSS-REFERENCE TO RELATED APPLICATIONS

This application is based upon and claims the benefit of priority from the prior Japanese Patent Application No. 2007-064876, filed on Mar. 14, 2007, the entire contents of which are incorporated herein by reference.

BACKGROUND

The present application relates to a data recovery circuit.

Program data or other data stored in a random-access memory (RAM) may include a soft error, which can occur due to various data damaging factors. To detect such an error in advance and prevent an erroneous system operation, a device that writes data to and reads data from the RAM performs parity checks. When a parity error is detected during a parity check, error correction is performed with firmware. However, the error correction using firmware requires a long processing time. Thus, a software error must be recovered more efficiently when performing a parity check.

A data recovery circuit that recovers data and has a parity check function adds a single parity bit to, for example, every byte of data in a RAM. During a writing operation, a data set of nine bits, which includes eight bits and a single parity bit added to the eight bits, is written to the RAM in a manner that the data set has, for example, an even number of bits of the value 1.

During a reading operation, the data set of nine bits undergoes a parity check to determine whether the data set has an even number of 1's. If the data stored in the RAM is damaged by a soft error, one bit of the data set would normally be inverted. Thus, the data set would have an odd number of 1's. In such a case, an error flag is generated, and an address at which the error has occurred is latched.

Subsequently, firmware is used to check the status of the error through interrupt processing and read the original data of the program data that includes the damaged data from an external memory, such as a flash memory. Then, the original data is rewritten to the RAM.

Japanese Laid-Open Patent Publication No. 2000-132461 describes an information control apparatus that regularly performs a parity error detection process for all program areas in a static random access memory (SRAM). When detecting a parity error, the information control apparatus rewrites data.

When an error is detected in program data that is stored in a RAM during a parity check, the data recovery circuit of the prior art must perform interrupt processing with an interrupt handler to entirely read the original program data from an external memory and rewrite the original data to the RAM. Therefore, the recovery process requires a long time.

Error correction may also be performed by adding an error checking and correcting (ECC) code to data. However, error correction using an ECC code requires an error correcting circuit. This would increase the circuit scale and as well as the access time.

SUMMARY

According to an aspect of one embodiment, a data recovery circuit that recovers data from a parity error without having to entirely rewrite data and without increasing the circuit scale is provided.

One aspect of the embodiment is a data recovery circuit for generating backup data of actual data with a plurality of memory regions. The data recovery circuit has a write circuit connected to the plurality of memory regions and includes a first parity generation circuit, which writes the actual data with even parity to an actual data region defined by one of the plurality of memory regions, and a second parity generation circuit, which writes the backup data with odd parity to at least one copy region defined by at least another one of the plurality of memory regions. Instead of the backup data, the second parity generation circuit is capable of writing any other actual data with even parity to the at least one copy region. A read circuit is connected to the plurality of memory regions to read data from the actual data region and the at least one copy region. The read circuit includes an even parity checker, which detects a parity error in the actual data based on the data read from the actual data region, and at least one odd parity checker, which checks whether the data read from the at least one copy region is the backup data.

Another aspect of the embodiment is a method for generating backup data of actual data with a plurality of memory regions. The method includes writing the actual data with even parity to an actual data region defined by one of the plurality of memory regions, writing the backup data with odd parity or any other actual data with even parity to at least one copy region defined by at least another one of the plurality of memory regions, reading data from the actual data region and the at least one copy region, detecting a parity error in the actual data based on the data read from the actual data region, and checking whether the data read from the at least one copy region is the backup data.

Other aspects and advantages of the embodiment will become apparent from the following description, taken in conjunction with the accompanying drawings, illustrating by way of example the principles of the invention.

BRIEF DESCRIPTION OF THE DRAWINGS

The embodiment, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
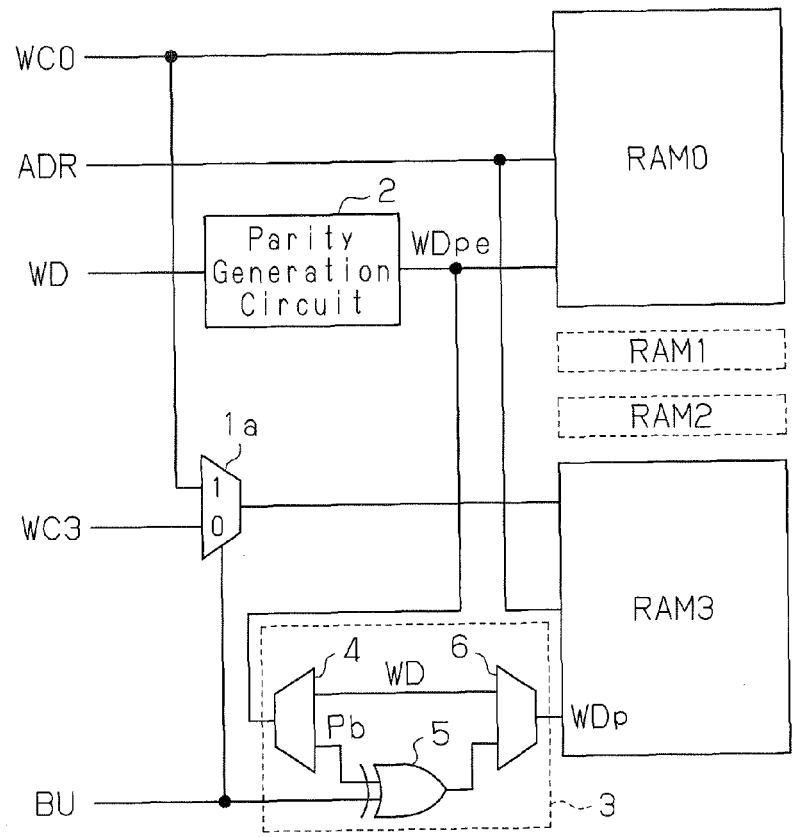
FIG. 1 is a schematic block circuit diagram of a write circuit according to a first embodiment.

In the drawings, like numerals are used for like elements throughout.

A data recovery circuit according to a first embodiment will now be described with reference to the drawings. The data recovery circuit includes a write circuit and a read circuit. FIG. 1 schematically shows the structure of the write circuit. The write circuit includes four memory regions RAM0 to RAM3 to which program data or other data can be written. When program data is once written in a memory region, data is basically not rewritten to that memory region.

In the first embodiment, among the four memory regions, the memory region RAM0 is used as an actual data region. Program data to which parity bits have been added is written to the memory region RAM0. The memory region RAM3, which remains as an empty region for a while, is used as a copy region. A copy of the program data to which parity bits have been added is written to the memory region RAM3 as backup data.

During a writing operation, a central processing unit (CPU) (not shown), which functions as a writing control unit, provides a write control signal WC0 to the memory region RAM0. The write control signal WC0 includes a plurality of signals that are necessary to control the writing of data to the memory region RAM. The write control signal WC0, which is provided to the memory region RAM0, is also provided to a selector 1a.

The selector 1a is also provided with a write control signal WC3 from the CPU. The selector 1a is provided with the write control signal WC3 from the CPU when program data is written to the memory region RAM3.

The selector 1a is also provided with a backup control signal BU from the CPU. When the backup control signal BU is set at a high level, the selector 1a selects the write control signal WC0 and provides the write control signal WC0 to the memory region RAM3. When the backup control signal BU is set at a low level, the selector 1a selects the write control signal WC3 and provides the write control signal WC3 to the memory region RAM3.

Write data WD is provided from the CPU to a parity generation circuit 2 (first parity generation circuit) as the program data that is written to the memory region RAM0. The parity generation circuit 2 adds a single parity bit to the write data WD, which includes, for example, eight bits, to generate write data WDpe having an even number of the value 1. That is, the parity generation circuit 2 generates the write data WDpe with even parity. Then, the parity generation circuit 2 provides the write data WDpe to the memory region RAM0. The write data WDpe generated in the parity generation circuit 2 is also provided to an inverse-parity generation unit 3.

The structure of the inverse-parity generation unit 3 will now be described in detail. The write data WDpe is separated into a parity bit Pb and write data WD by a separation circuit 4. The parity bit Pb is provided to an EOR circuit 5, which is also provided with the backup control signal BU. A synthesizing circuit 6 synthesizes the write data WD, which is output from the separation circuit 4, and an output signal of the EOR circuit 5, to generate 9-bit write data WDp. The synthesizing circuit 6 provides the 9-bit write data WDp to the memory region RAM3.

When the backup control signal BU has a high level, the control signal WC0 is provided to the memory region RAM3. In this case, if the parity bit Pb has a value of 0, the EOR circuit 5 inverts the parity bit Pb to the value of 1. If the parity bit Pb is 1, the EOR circuit 5 inverts the parity bit Pb to 0. When, for example, the parity generation circuit 2 generates the write data WDpe with even parity, the write data WDp is written to the memory region RAM3 with odd parity, or data having an odd number of the value 1.

When the backup control signal BU has a low level, the control signal WC3 is provided to the memory region RAM3. In this case, the parity bit Pb is not inverted in the inverse-parity generation unit 3. The write data WDpe (WDp) having even parity is written to the memory region RAM3. In the first embodiment, the selector 1a and the inverse-parity generation unit 3 form a second parity generation circuit.

Figure 2:
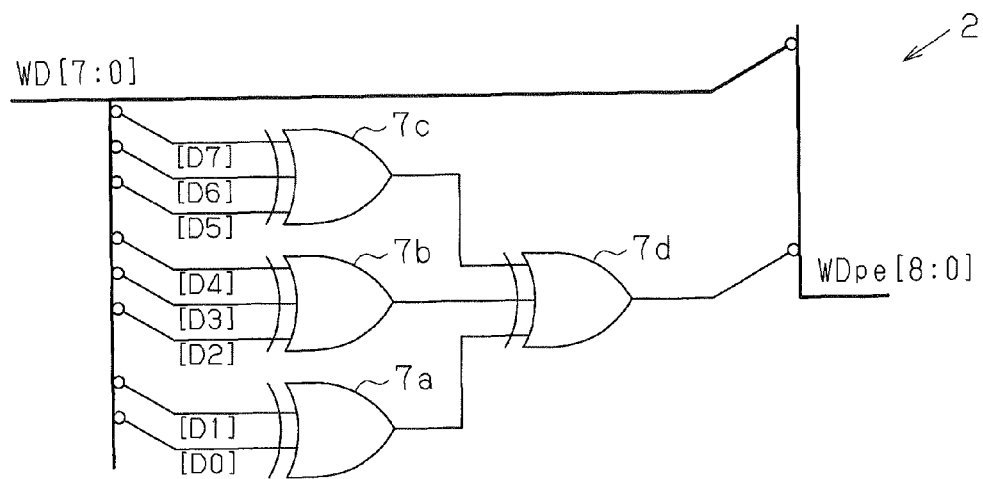
FIG. 2 is a schematic circuit diagram of a parity generation circuit shown in FIG. 1.

FIG. 2 shows the structure of the parity generation circuit 2 shown in FIG. 1 in detail. The write data WD includes eight pieces of data, namely, data D0 to D7. An EOR circuit 7a is provided with the data D0 and D1. An EOR circuit 7b is provided with the data D2 to D4. An EOR circuit 7c is provided with the data D5 to D7.

Output signals of the EOR circuits 7a to 7c are provided to an EOR circuit 7d. An output signal of the EOR circuit 7d is synthesized with the write data WD to generate the 9-bit write data WDpe.

In the parity generation circuit 2, the EOR circuit 7d outputs a signal having a value of 1 when the write data D0 to D7 includes an odd number of 1's. Further, the EOR circuit 7d outputs a signal having a value of 0 when the write data D0 to D7 includes an even number of 1's. As a result, the write data WDpe output from the parity generation circuit 2 has even parity.

The memory regions RAM0 and RAM3 are provided with an address signal ADR from the CPU. In the memory regions RAM0 and RAM3, a writing operation or a reading operation is performed at addresses corresponding to the address signal ADR.

The operation of the write circuit will now be described.

When the backup control signal BU has a high level, the write control signal WC0 is provided to both of the memory regions RAM0 and RAM3. The write data WDPe, which is generated in the parity generation circuit 2 to have even parity, is sequentially written at addresses of the memory region RAM0 that are selected in accordance with the address signal ADR.

At the same time, the write data WDp, which is generated in the inverse-parity generation unit 3 to have odd parity, is sequentially written at addresses of the memory region RAM3 that are selected in accordance with the address signal ADR. In this case, the memory region RAM3 is used as a copy region of the memory region RAM0. The write data WDp functions as backup data.

When the backup control signal BU has a low level, the write control signal WC3 is provided to the memory region RAM3. In this case, the memory region RAM3 is used as an actual data region, and program data differing from the data stored in the memory region RAM0 or other data is rewritable to the memory region RAM3 with even parity.

Figure 3:
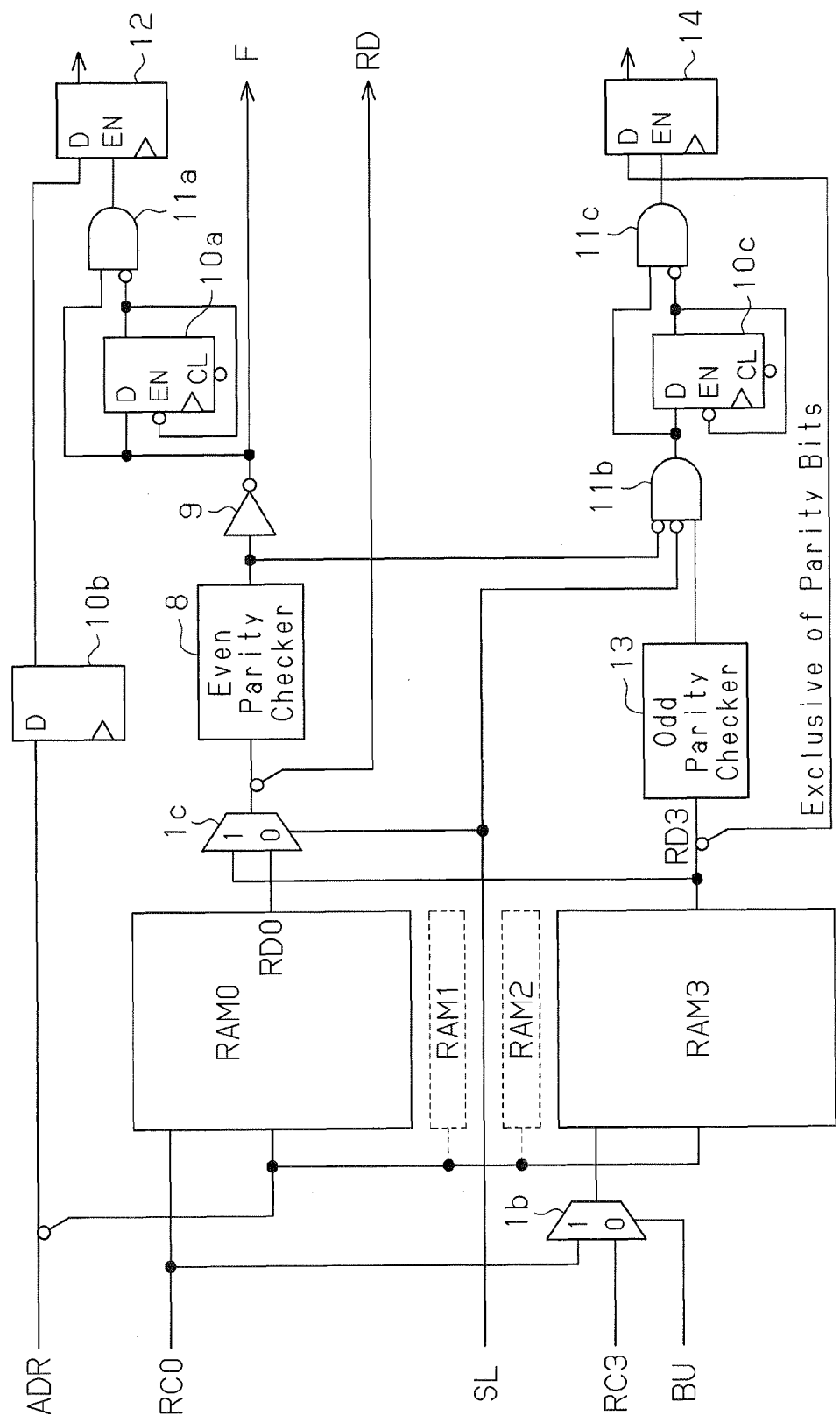
FIG. 3 is a schematic block circuit diagram of a read circuit in the first embodiment.

FIG. 3 shows the read circuit of the data recovery circuit. A read control signal RC0 is provided to the memory region RAM0 from the CPU. The read control signal RC0 is also provided to a selector 1b. The selector 1b is also provided with a read control signal RC3 from the CPU. Each of the read control signals RC0 and RC3 includes a plurality of control signals that are necessary to read data from the memory regions RAM0 and RAM3.

The selector 1b is further provided with a backup control signal BU. When the backup control signal BU has a high level, the read control signal RC0 is provided from the selector 1b to the memory region RAM3. When the backup control signal BU has a low level, the read control signal RC3 is provided from the selector 1b to the memory region RAM3.

Read data RD0 read from the memory region RAM0 and read data RD3 read from the memory region RAM3 are provided to a selector 1c. The selector 1c is further provided with a selection signal SL from the CPU. When the selection signal SL has a high level, the selector 1c outputs the read data RD3, which has been read from the memory region RAM3. When the selection signal SL has a low level, the selector 1c outputs the read data RD0, which has been read from the memory region RAM0.

An output signal of the selector 1c is provided to an even parity checker 8. Data generated by eliminating a parity bit from the output signal of the selector 1c is provided to the CPU as read data RD. The even parity checker 8 generates a signal having a high level when the read data output from the selector 1c has even parity and generates a signal having a low level when the read data output from the selector 1c has odd parity.

The output signal of the even parity checker 8 is provided to an inverter circuit 9. When the output signal of the even parity checker 8 has a low level, that is, when the read data RD0 read from the memory region RAM0 includes a parity error, the inverter circuit 9 outputs an interruption flag F having a high level.

The output signal of the inverter circuit 9 is provided to a flip-flop circuit 10a and an AND circuit 11a. The flip-flop circuit 10a generates an output signal that is slightly delayed from its input signal. An inverted signal of the output signal from the flip-flop circuit 10a is provided to the AND circuit 11a. Thus, when the output signal of the inverter circuit 9 shifts from a low level to a high level, the two input signals of the AND circuit 11a both have a high level only during a period corresponding to the delay time of the flip-flop circuit 10a. As a result, an output signal of the AND circuit 11a is set at a high level during that period.

The output signal of the AND circuit 11a is provided as an enable signal EN to an address holding register 12. The address holding register 12 is also provided with an address signal ADR as a data signal via a flip-flop circuit 10b. When the enable signal EN has a high level, the address holding register 12 latches the address signal ADR that has been received. In FIG. 3, the address holding register 12 is configured to latch each bit of the address signal ADR. The flip-flop circuit 10a sets a parity error flag. The address holding register 12 is not updated even when another error occurs unless the parity error flag of the flip-flop circuit 10a is cleared.

When a parity error occurs in the read data RD0 read from the memory region RAM0, the read circuit latches the address ADR at which the error has occurred with the address holding register 12.

The read data RD3 read from the memory region RAM3 is provided to an odd parity checker 13. The odd parity checker 13 generates a signal having a high level when the read data RD3 of the memory region RAM3 has odd parity and generates a signal having a low level when the read data RD3 of the memory region RAM3 has even parity.

An AND circuit 11b is provided with an output signal of the odd parity checker 13, an inverted signal of the selection signal SL, and an inverted signal of an output signal of the even parity checker 8. The AND circuit 11b generates an output signal having a high level when the output signal of the odd parity checker 13 has a high level, the selection signal SL has a low level, and the output signal of the even parity checker 8 has a low level. In other words, the AND circuit 11b generates a high level output signal when the backup data written to the memory region RAM3 has odd parity, the selector 1c selects the memory region RAM0, and a parity error has occurred in the read data RD read from the memory region RAM0.

A flip-flop circuit 10c operates in the same manner as the flip-flop circuit 10a, and an AND circuit 11c operates in the same manner as the AND circuit 11a. Thus, when an output signal of the AND circuit 11b shifts from a low level to a high level, the AND circuit 11c provides a high level enable signal EN to a backup data storage register 14.

In response to the high level enable signal EN, the backup data storage register 14 latches data from which the parity bit has been eliminated from the read data RD3 read from the memory region RAM3. When the read data RD0 read from the memory region RAM0 includes a parity error and the read data RD3 read from the memory region RAM3 is backup data having odd parity, the backup data read from the memory region RAM3 is stored in the backup data storage register 14 at the same address as the address of the data read from the memory region RAM0 at which a parity error has occurred.

The flip-flop circuit 10c sets a backup data storage flag. The backup data storage register 14 is not updated even when the next backup permission is granted unless the backup data storage flag of the flip-flop circuit 10c is cleared.

The interruption flag F is provided to an interrupt handler (not shown). When the interruption flag F has a high level, the interrupt handler provides the address stored in the address holding register 12 and the backup data stored in the backup data storage register 14 to the CPU. This backs up the read data RD that includes a parity error.

Figure 4:
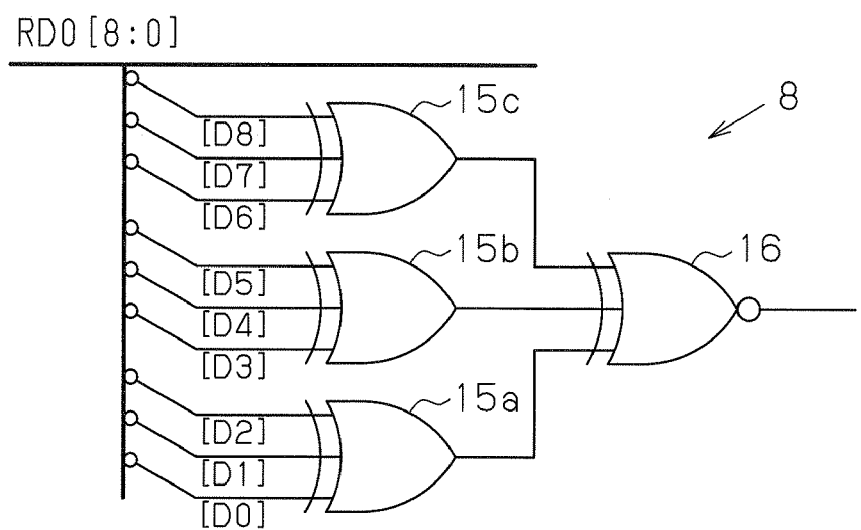
FIG. 4 is a schematic circuit diagram of an even parity checker shown in FIG. 3.

FIG. 4 shows the structure of the even parity checker 8 in detail. The 9-bit read data RD0 is provided to EOR circuits 15a to 15c, with each receiving three of the nine bits. Output signals of the EOR circuits 15a to 15c are provided to an ENOR circuit 16. The ENOR circuit 16 generates an output signal of the even parity checker 8. The ENOR circuit 16 generates an output signal having a high level when the read data RD0 has even parity and generates an output signal having a low level when the read data RD0 has odd parity.

Figure 5:
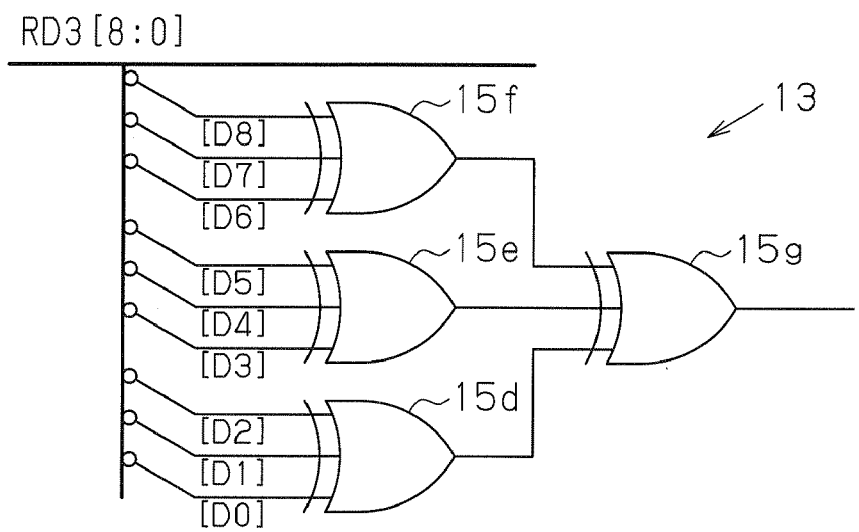
FIG. 5 is a schematic circuit diagram of an odd parity checker shown in FIG. 3.

FIG. 5 shows the structure of the odd parity checker 13 in detail. The 9-bit read data RD3 is provided to the EOR circuits 15d to 15f, with each receiving three of the nine bits. Output signals of the EOR circuits 15d to 15f are provided to the EOR circuit 15g. The EOR circuit 15g generates an output signal of the odd parity checker 13. The EOR circuit 15g generates an output signal having a high level when the read data RD3 has odd parity and generates an output signal having a low level when the read data RD3 has even parity.

The operation of the read circuit will now be described. As described above, program data with even parity is written to the memory region RAM0, which is used as an actual data region. Backup data with odd parity is written to the memory region RAM3, which is used as a copy region. The selection signal SL is set at a low level, and the backup signal BU is set at a high level.

In this state, program data (RD0) is read from the memory region RAM0 based on the address signal ADR, which is provided from the CPU. The selector 1c provides the read data RD0 to the even parity checker 8 in response to the low level selection signal SL. The even parity checker 8 determines whether the read data RD0 has even parity, that is, whether no parity error has occurred in the read data RD0.

The read data RD3 corresponding to the address signal ADR is read from the memory region RAM3 based on the read control signal RC0. The odd parity checker 13 determines whether the read data RD3 has odd parity.

When a parity error has occurred in the read data RD0, the address holding register 12 holds the address at which the error has occurred. Also, the backup data storage register 14 holds the backup data of the memory region RAM3 corresponding to the address at which the error has occurred. In response to an interruption flag F, the interrupt handler performs a backup operation based on the address held in the address holding register 12 and the backup data held in the backup data storage register 14.

When the read data RD3 does not have odd parity, the odd parity checker 13 outputs a signal having a low level. Accordingly, the backup data storage register 14 does not hold backup data.

When the memory region RAM3 is used as an actual data region to which program data is written, the selection signal SL is set at a high level and the backup signal BU is set at a low level.

In this case, the memory region RAM3 is provided with the read control signal RC3. The selector 1c selects the read data RD3 read from the memory region RAM3 as its output signal based on the read control signal RC3 and the address signal ADR. As a result, data generated by eliminating a parity bit from the read data RD3 is provided to the CPU as the read data RD.

The data recovery circuit of the first embodiment has the advantages described below.

(1) Among the plurality of memory regions (RAM0 to RAM3), when the memory region RAM0 is used as an actual data region to which program data is written, the empty memory region RAM3 is used as a copy region to which a backup copy identical to the program data is written in parallel to the program data written to the memory region RAM0. When an error occurs in the program data read from the memory region RAM0, the backup data stored in the copy region is used to correct the error, that is, recover the program data from the error. Accordingly, there is no need for rewriting the program data with firmware. Thus, data recovery is readily performed.

(2) The copy region in which the backup data is stored may be used as an actual data region to which data other than backup data can be stored.

(3) Program data with even parity is written to the memory region RAM0, which is an actual data region. In a reading operation, the even parity checker 8 checks for a parity error of the program data. Also, backup data with odd parity is written to the memory region RAM3, which is a copy region. The odd parity checker 13 detects the backup data stored in the memory region RAM3 during the reading operation. When the even parity checker 8 detects a parity error, the even parity checker 8 generates an interruption flag F. The address at which the error has occurred is stored in the address holding register 12. Further, the backup data of the memory region RAM3 corresponding to the address is stored in the backup data storage register 14. In this manner, when a parity error is detected, the error is corrected based on the interruption flag F, the address stored in the address holding register 12, and the backup data stored in the backup data storage register 14.

(4) The circuit scale is smaller than a data recovery circuit that uses an ECC code.

Figure 6:
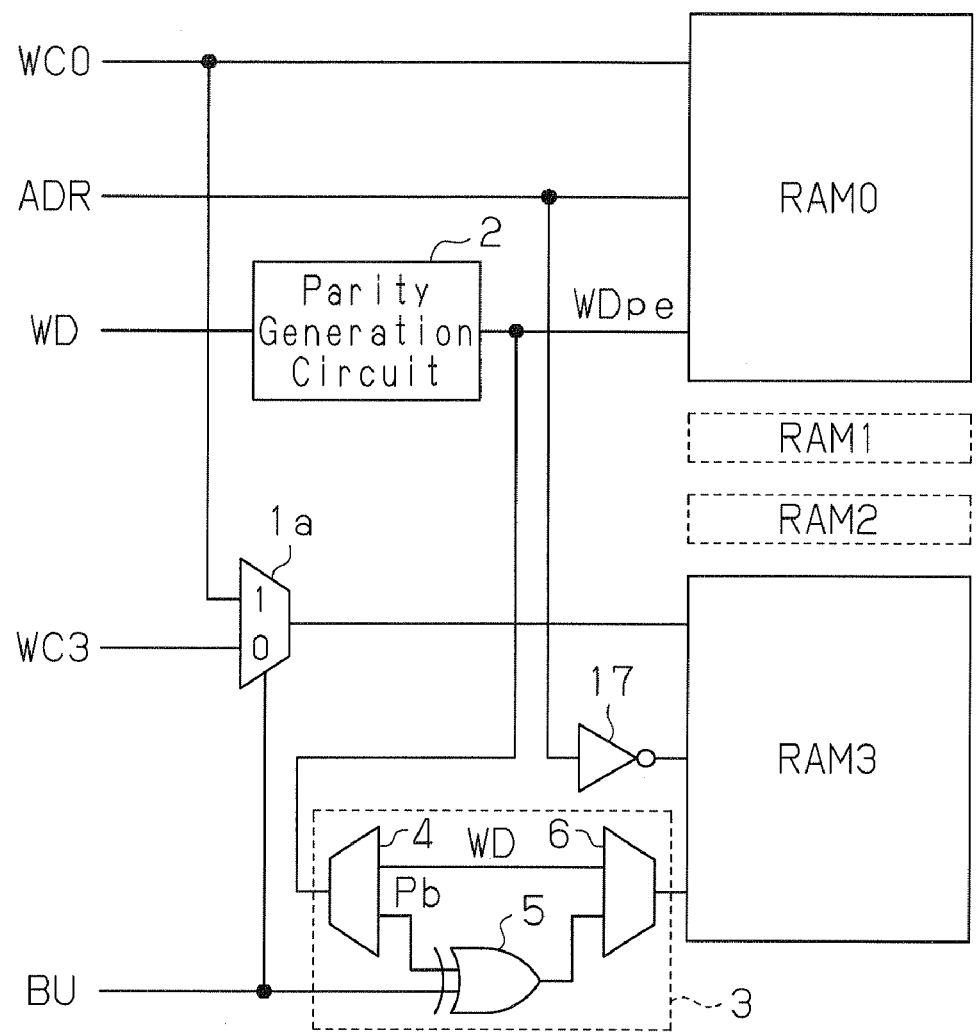
FIG. 6 is a schematic block circuit diagram of a write circuit according to a second embodiment.

FIG. 6 shows a write circuit of a data recovery circuit according to a second embodiment. The write circuit is formed by adding an inverter circuit 17 (address generation circuit) to the write circuit (FIG. 1) of the first embodiment except and may be used in lieu of the write circuit shown in FIG. 1. The data recovery circuit of the second embodiment uses a read circuit that is the same as the read circuit (FIG. 3) of the first embodiment.

When program data is written to the memory region RAM0, the inverter circuit 17 provides an inverted signal of an address signal ADR to the memory region RAM3, which is used as a copy region. Accordingly, when backup data is written to the memory region RAM3 in parallel with the writing of the program data to the memory region RAM0, if data is sequentially written to the memory region RAM0 from lower rank addresses, data would be sequentially written to the memory region RAM3 from upper rank addresses.

After backup data is written to the memory region RAM3 in the write circuit shown in FIG. 6, when using the memory region RAM3 as an actual data region to rewrite data, the data is sequentially written from lower rank addresses.

In addition to the advantages of the first embodiment, the data recovery circuit of the second embodiment has the advantage described below.

(5) As long as data is not rewritten at all of the addresses in the memory region RAM3, backup data would remain at upper rank addresses of the memory regions RAM3. Accordingly, even if the memory region RAM3 is subsequently used as an actual data region, there is a higher possibility that the backup data remaining in the memory region RAM3 may be used to correct a parity error in the memory region RAM0.

Figure 7:
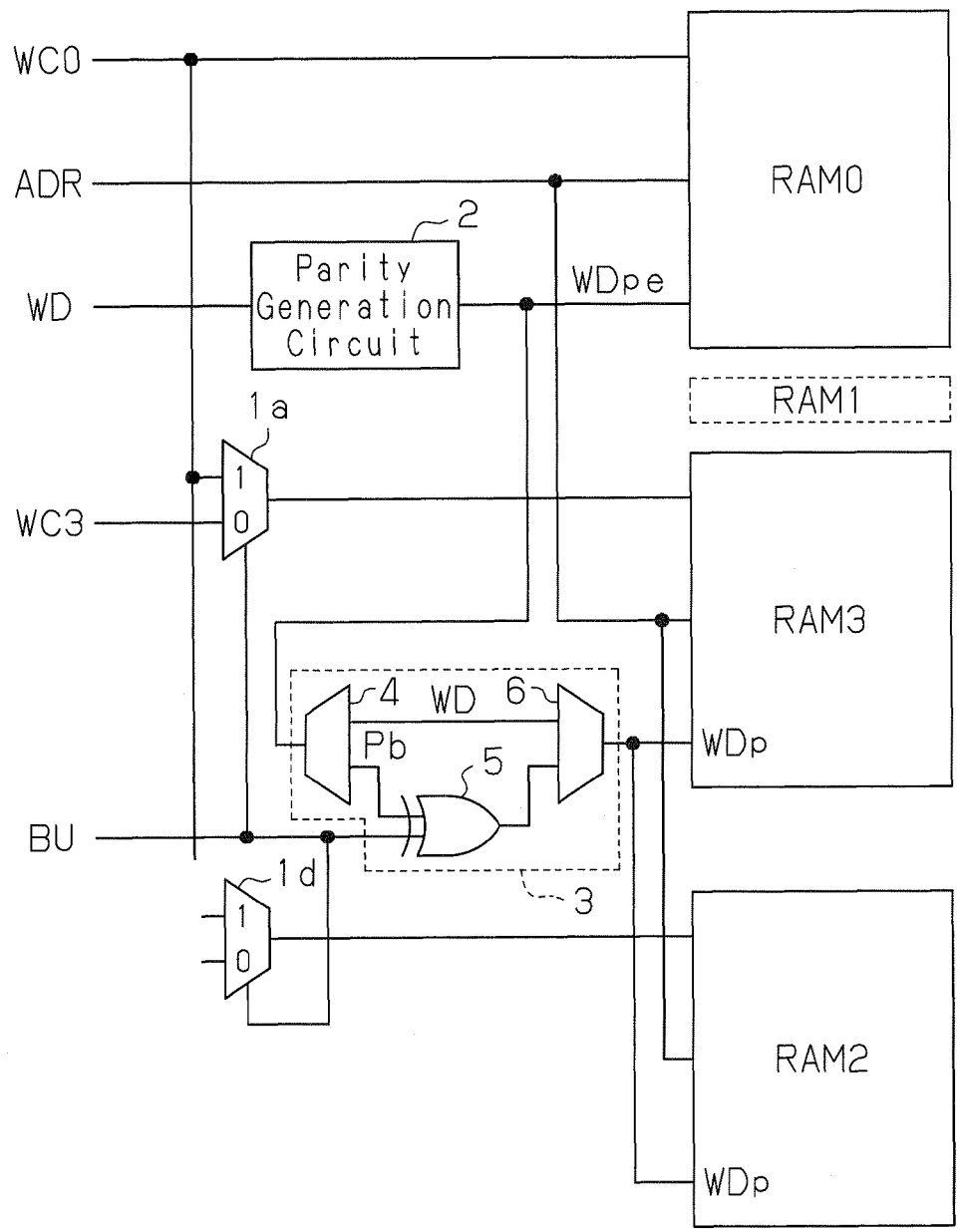
FIG. 7 is a schematic block circuit diagram of a write circuit according to a third embodiment.
Figure 8:
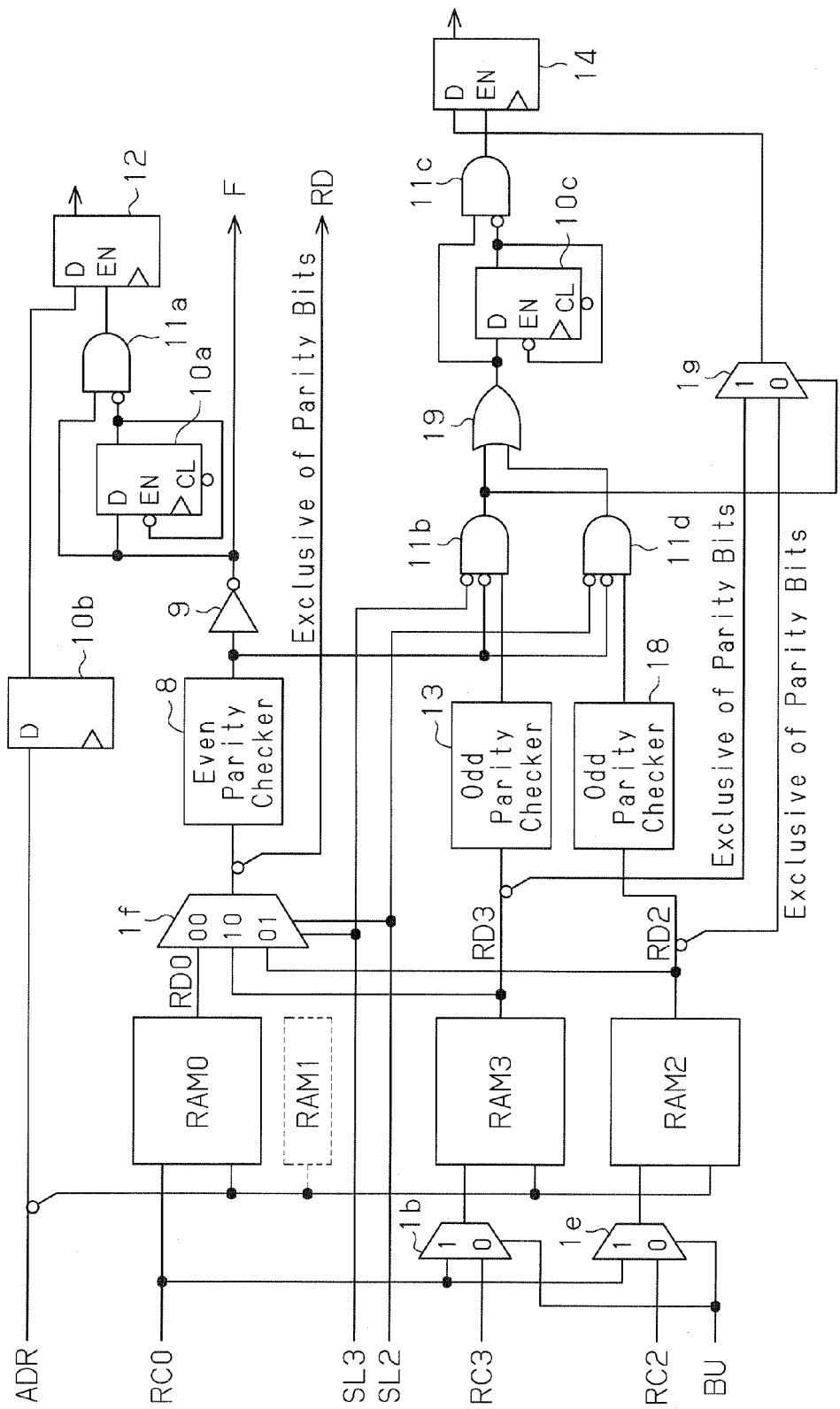
FIG. 8 is a schematic block circuit diagram of a read circuit in the third embodiment.

FIGS. 7 and 8 show a data recovery circuit according to a third embodiment. In parallel with the writing of program data to an actual data region (RAM0), the data recovery circuit of the third embodiment writes copies, or backup data, of the program data to a plurality of copy regions (e.g., memory regions RAM2 and RAM3).

FIG. 7 shows a write circuit included in the data recovery circuit of the third embodiment. Referring to FIG. 7, in addition to the memory region RAM3, the memory region RAM2 is also used as a copy region.

An address signal ADR, which is provided to the memory region RAM0, is provided to the memory region RAM2 and the memory region RAM3. Write data WDp, which is output from the inverse-parity generation unit 3, is provided to the memory region RAM2 and the memory region RAM3.

A selector 1d is provided with a write control signal WC0 for the memory region RAM0, a write control signal WC2 for the memory region RAM2, and a backup signal BU. When the backup signal BU has a high level, the write control signal WC0 is provided to the memory region RAM2. When the backup signal BU has a low level, the write control signal WC2 is provided to the memory region RAM2.

In this write circuit, the write control signal WC0 of the memory region RAMS is written to the memory regions RAM3 and RAM2 when the backup signal BU has a high level. Accordingly, in parallel to the writing of program data with even parity to the memory region RAMS, backup data with odd parity is written to the memory regions RAM3 and RAM2. In the third embodiment, the selectors 1a and 1d and the inverse-parity generation unit 3 operate as a second parity generation circuit that writes backup data to the memory regions RAM3 and RAM2 in parallel.

When the backup signal BU has a low level, the write control signal WC3 is provided to the memory region RAM3 and the write control signal WC2 is provided to the memory region RAM2. Accordingly, the memory regions RAM3 and RAM2 are each usable as an actual data region for writing program data.

FIG. 8 shows a read circuit included in the data recovery circuit of the third embodiment.

An address signal ADR is provided to the memory regions RAM0 to RAM3. A read control signal RC0 for the memory region RAM0 is provided to a selector 1e and the selector 1b. The selector 1e is further provided with a read control signal RC2 for the memory region RAM2. When the backup signal BU has a high level, the selector 1e provides the read control signal RC2 to the memory region RAM2. When the backup signal BU has a low level, the selector 1e provides the read control signal RC2 to the memory region RAM2.

The read data RD0, RD3, and RD2 of the memory regions RAM0, RAM3, and RAM2 are provided to the selector 1f.

The selector if selects one of the read data RD0, RD3, and RD2 based on selection signals SL2 and SL3, which are provided from the CPU, and provides the selected read data to the even parity checker 8.

More specifically, when the selection signals SL2 and SL3 both have a low level, the selector if outputs the read data RD0. When the selection signal SL3 has a high level and the selection signal SL2 has a low level, the selector 1f outputs the read data RD3. When the selection signal SL3 has a low level and the selection signal SL2 has a high level, the selector 1f outputs the read data RD2.

The AND circuit 11b generates an output signal based on an output signal of the odd parity checker 13, an inverted signal of an output signal of the even parity checker 8, and an inverted signal of the selection signal SL3. The output signal of the AND circuit 11b is provided to an OR circuit 19.

The read data RD2 read from the memory region RAM2 is provided to the odd parity checker 18. An AND circuit 11d generates an output signal based on an output signal of the odd parity checker 18, an inverted signal of the output signal of the even parity checker 8, and an inverted signal of the selection signal SL2. The output signal of the AND circuit 11d is provided to an OR circuit 19. An output signal of the OR circuit 19 is provided to the flip-flop circuit 10c and the AND circuit 11c.

Data generated by eliminating a parity bit from the read data RD3 read from the memory region RAM3 (backup data) and data generated by eliminating a parity bit from the read data RD2 read from the memory region RAM2 (backup data) are provided to a selector (selection unit) 1g. When the output signal of the AND circuit 11b has a high level, the selector 1g provides the backup data included in the read data RD3 to the backup data storage register 14. When the output signal of the AND circuit 11b has a low level, the selector 1g provides the backup data included in the read data RD2 to the backup data storage register 14. The remaining structure of the read circuit is the same as the structure of the first embodiment (FIG. 3).

The operation of the read circuit shown in FIG. 8 will now be described. As described above, program data with even parity is written to the memory region RAM0, which is used as an actual data region, and backup data with odd parity is written to the memory regions RAM3 and RAM2, which are used as copy regions. The selection signals SL2 and SL3 are each set at a low level. The backup signal BU is set at a high level.

In this state, program data (RD0) is read from the memory region RAM0 based on the address signal ADR, which is provided from the CPU. The selector 1f provides the read data RD0 to the even parity checker 8 in response to the low level selection signals SL2 and SL3. The even parity checker 8 determines whether the read data RD0 has even parity, that is, whether the read data RD0 has no parity error.

The read data RD3 and RD2 corresponding to the address signal ADR are read from the memory regions RAM3 and RAM2 based on the read control signal RC0. The odd parity checkers 13 and 18 determine whether the read data RD3 and RD2 have odd parity.

When the read data RD0 includes a parity error, the address at which the error has occurred is held in the address holding register 12. Also, when backup data with odd parity is written to the memory regions RAM3 and RAM2, the AND circuits 11b and 11d generate high level output signals. In this case, the selector 1g selects data generated by eliminating a parity bit from the read data RD3 read from the memory region RAM3. Accordingly, the backup data storage register 14 latches the backup data included in the read data RD3.

When data other than the backup data is rewritten to the memory region RAM3, that is, when the read data RD3 has even parity, the AND circuit 11b generates a low level output signal. In this case, the selector 1g selects data generated by eliminating a parity bit from the read data RD2 read from the memory region RAM2. Accordingly, the backup data storage register 14 latches the backup data included in the read data RD2.

When the read data RD0 includes a parity error, an interruption flag F is provided to the interrupt handler. In response to the interruption flag, the interrupt handler performs the backup operation based on the address stored in the address holding register 12 and the backup data stored in the backup data storage register 14.

When the memory regions RAM3 and RAM2 are used as actual data regions to which program data is written and program data is read from one of the memory regions RAM3 and RAM2, one of the selection signals SL2 and SL3 is set at a high level, and the backup signal BU is set at a low level.

In this case, the read control signal RC3 is provided to the memory region RAM3, and the read control signal RC2 is provided to the memory region RAM2. The selector 1f selects, as an output signal, either one of the read data RD3, which is read from the memory region RAM3 based on the read control signal RC3 and the address signal ADR, and the read data RD2, which is read from the memory region RAM2 based on the read control signal RC2 and the address signal ADR. As a result, data generated by eliminating a parity bit from the selected read data (RD2 or RD3) is provided to the CPU as the read data RD.

In addition to the advantages of the first embodiment, the data recovery circuit of the third embodiment has the advantage described below.

(6) Backup data is written in parallel to the memory regions RAM3 and RAM2, which are used as a plurality of copy regions. Thus, when one of the copy regions (RAM3 and RAM2) is rewritten with program data and used as an actual data region, the backup data can be read from the other copy region. Accordingly, there is a higher possibility of the read data RD0 read from the memory region RAM0 being recovered if there is an error.

Figure 9:
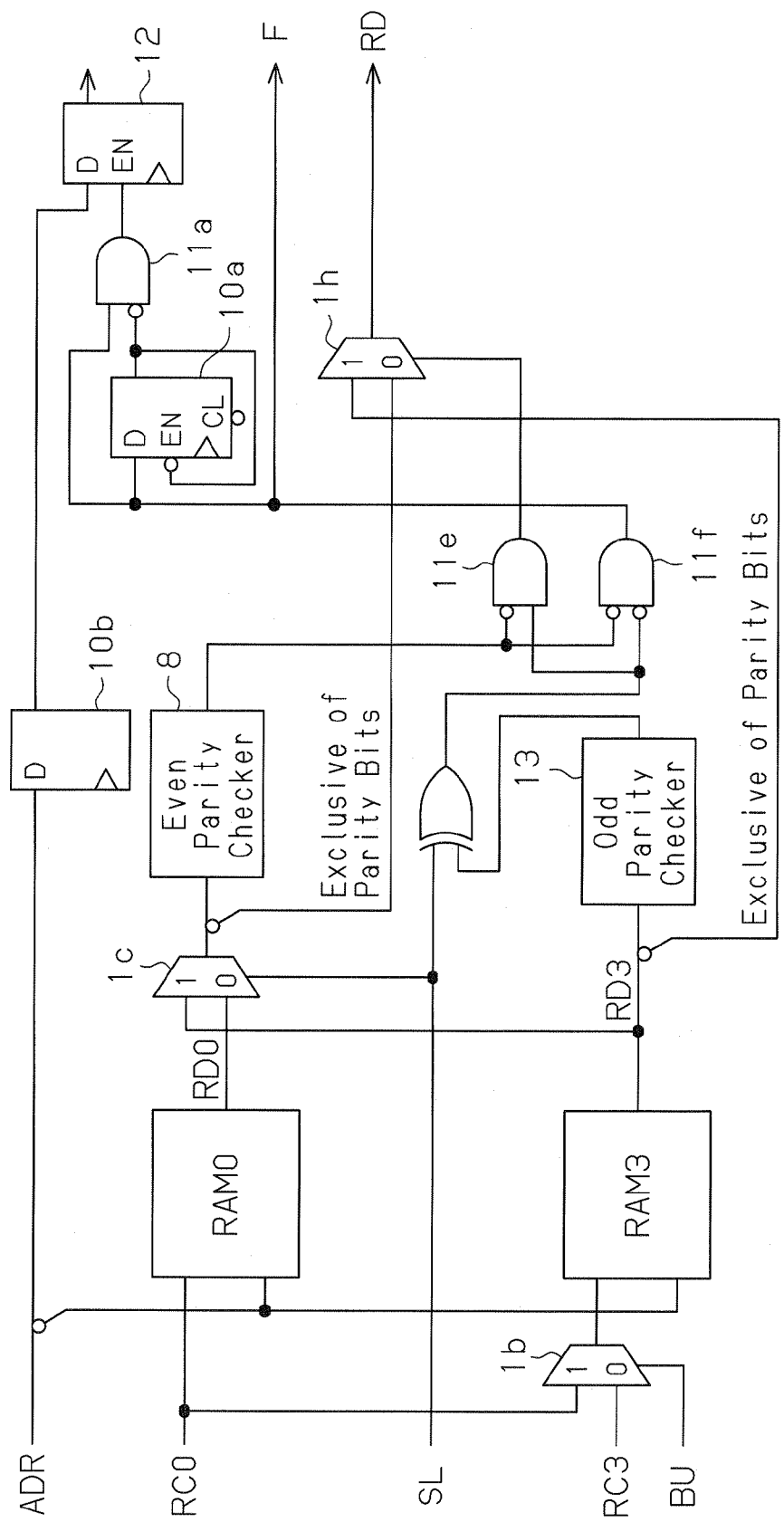
FIG. 9 is a schematic block circuit diagram of a read circuit according to a fourth embodiment.

FIG. 9 shows a read circuit included in a data recovery circuit according to a fourth embodiment. The read circuit may be used in lieu of the read circuit shown in FIG. 3. When a parity error occurs in the data read from the actual data region, the read circuit of the fourth embodiment functions to replace the data read from an actual data region with the backup data read from a copy region. The write circuit of the data recovery circuit in the fourth embodiment is identical to the write circuit (FIG. 1) of the first embodiment.

An AND circuit 11e is provided with an inverted signal of an output signal of the even parity checker 8 and an output signal of the odd parity checker 13. An AND circuit 11f is provided with an inverted signal of an output signal of the even parity checker 8 and an inverted signal of an output signal of the odd parity checker 13.

A selector 1h selects, as read data RD, either one of data generated by eliminating a parity bit from the read data selected by the selector 1c and data generated by eliminating a parity bit from the read data RD3 read from the memory region RAM3 in accordance with an output signal of the AND circuit 11e.

More specifically, when the output signal of the AND circuit 11e has a low level, the selector 1h selects the data generated based on the output signal (RD0 or RD3) of the selector 1c as the read data RD. When the output signal of the AND circuit 11e has a high level, the selector 1h outputs the data from which the parity bit has been eliminated from the read data RD3 as the read data RD. The AND circuits 11e and 11f and the selector 1h function as a replacement circuit for replacing read data RD0 that includes a parity error with the backup data.

The output signal of the AND circuit 11f is used as an interruption flag F and provided to the flip-flop circuit 10a and the AND circuit 11a.

In the read circuit shown in FIG. 9, when the read data RD0 read from the memory region RAM0 has an even parity and is provided to the even parity checker 8 via the selector 1c, the output signal of the even parity checker 8 has a high level.

Accordingly, the output signal of the AND circuit 11e is set at a low level. As a result, the data generated by eliminating a parity bit from the read data RD0 is output from the selector 1h as the read data RD.

When the read data RD0 provided to the even parity checker 8 has odd parity, that is, when an error has occurred in the read data RD0, the output signal of the even parity checker 8 has a low level. In this case, the output signal of the odd parity checker 13 has a high level when backup data with odd parity is stored in the memory region RAM3.

Thus, the output signal of the AND circuit 11e is set at a high level. As a result, the data generated by eliminating a parity bit from the read data RD3 is output from the selector 1h as the read data RD. More specifically, the read data RD that includes an error is replaced by the backup data based on the read data RD3 of the memory region RAM3.

Further, when the memory region RAM3 is used as an actual data region from which actual data (program data) is read, the backup signal BU is set at a low level. As a result, a reading operation is performed in the memory region RAM3 based on the read control signal RC3. The selection signal SL is then set at a high level.

Accordingly, the even parity checker 8 receives the read data RD3 read from the memory region RAM3 via the selector 1c. In this case, the output signal of the even parity checker 8 is set at a high level based on the read data RD3 having even parity. The output signal of the AND circuit 11e is set at a low level. As a result, the data generated by eliminating a parity bit from the read data RD3 is read from the selector 1h as the read data RD.

In addition to the advantages (1), (2), and (4) of the first embodiment, the data recovery circuit of the fourth embodiment has the advantages described below.

(7) When a parity error occurs in the data read from the memory region RAM0, which is used as an actual data region, the data including the error is replaced with backup data that is stored in a copy region. Accordingly, data is readily recoverable from the parity error.

Figure 10:
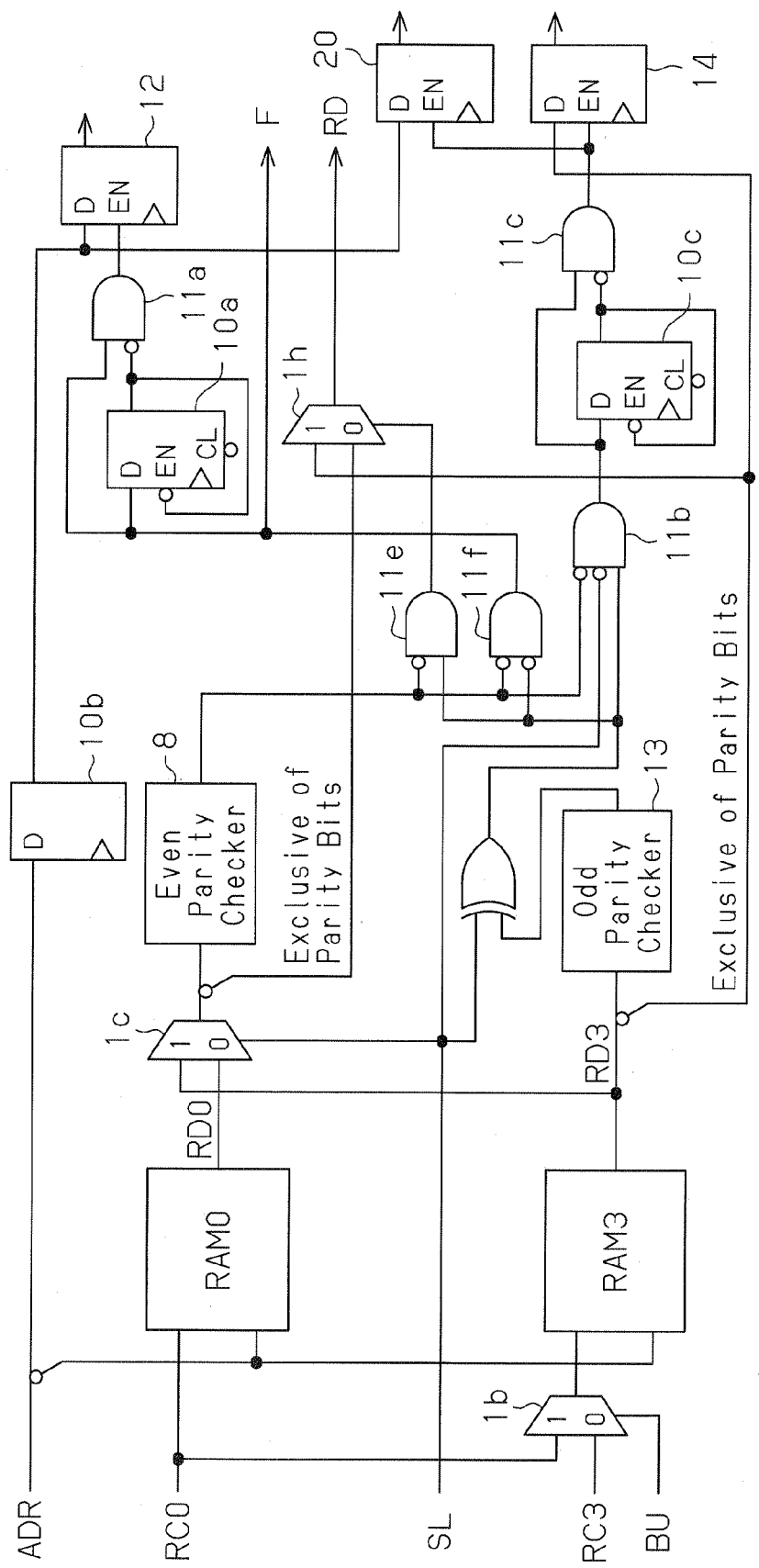
FIG. 10 is a schematic block circuit diagram of a read circuit according to a fifth embodiment.

FIG. 10 shows a read circuit of a data recovery circuit according to a fifth embodiment. The read circuit may be used in lieu of the read circuit shown in FIG. 3. The read circuit of the fifth embodiment is formed by adding to the read circuit (FIG. 9) of the fourth embodiment elements for storing backup data (the flip-flop circuit 10c, the AND circuits 11b and 11c, and the register 14 shown in FIG. 3) and a register 20 for storing an address at which backup processing has been performed. The data recovery circuit of the fifth embodiment uses a write circuit that is identical to the write circuit (FIG. 1) of the first embodiment.

An output signal of the AND circuit 11c is provided to the backup address holding register 20 as an enable signal. The backup address holding register 20 is provided with an address signal ADR from the flip-flop circuit 10b.

Accordingly, at the same time as when the backup data is stored in the backup data storage register 14, the address at which the backup processing has been performed is stored in the backup address holding register 20.

In the read circuit of FIG. 10, when read data RD0 having even parity is read from the memory region RAM0 and provided to the even parity checker 8 via the selector 1c, the data generated by eliminating a parity bit from the read data RD0 is output from the selector 1h as the read data RD.

When read data RD0 having odd parity is provided to the even parity checker 8 and backup data having odd parity is stored in the memory region RAM3, the data generated by eliminating a parity bit from the read data RD3 is output from the selector 1h as the read data RD.

In this state, the read data RD (backup data) is stored in the backup data storage register 14, and the address at which the backup data stored in the memory region RAM3 is output as the read data RD is stored in the backup address holding register 20.

When the memory region RAM3 is used as an actual data region from which actual data (program data) is read, the backup signal BU is set at a low level. As a result, a reading operation is performed in the memory region RAM3 based on the read control signal RC3. Further, the selection signal SL is set at a high level.

The even parity checker 8 receives the read data RD3 of the memory region RAM3 via the selector 1c. In this state, the output signal of the even parity checker 8 is set at a high level based on the read data RD3 with even parity. The output signal of the AND circuit 11e is set at a low level. As a result, the data generated by eliminating a parity bit from the read data RD3 is output from the selector 1h as the read data RD.

In addition to the advantages of the first and fourth embodiments, the data recovery circuit of the fifth embodiment has the advantage described below.

(8) The address at which a parity error occurs is stored in the register 20 and the backup data that replaces the data including the parity error is stored in the register 14. This enables correction of erroneous data stored in the actual data region based on the address and the backup data at any timing with the use of firmware (not shown).

It should be apparent to those skilled in the art that the embodiment may be embodied in many other specific forms without departing from the spirit or scope of the aforementioned embodiments. Particularly, it should be understood that the embodiment may be embodied in the following forms.

Program data (actual data) with odd parity may be written to an actual data region and backup data with even parity may be written to a copy region.

Data stored in an actual data region does not have to be program data.

In the third to fifth embodiments, backup data may be sequentially written to the memory region RAM3 or RAM2 in from of upper rank bits of the memory region RAM3 or RAM2 in the same manner as in the second embodiment.

The present examples and embodiments are to be considered as illustrative and not restrictive, and the embodiments are not to be limited to the details given herein, but may be modified within the scope and equivalence of the appended claims.

What is claimed is:

1. A data recovery circuit for generating backup data of actual data with a plurality of memory regions, the data recovery circuit comprising:

a write circuit coupled to the plurality of memory regions including:

a first parity generation circuit which writes the actual data with even parity to an actual data region defined by one of the plurality of memory regions; and a second parity generation circuit which writes the backup data with odd parity to at least one copy region defined by at least another one of the plurality of memory regions, wherein instead of the backup data, the second parity generation circuit is capable of writing any other actual data with even parity to the at least one copy region; and a read circuit connected to the plurality of memory regions to read data from the actual data region and the at least one copy region, the read circuit including:

an even parity checker which detects a parity error in the actual data based on the data read from the actual data region; and at least one odd parity checker which checks whether the data read from the at least one copy region is the backup data.

2. The data recovery circuit according to claim 1, wherein the second parity generation circuit writes the backup data or the other actual data to the at least one copy region in accordance with a backup control signal.

3. The data recovery circuit according to claim 1, wherein the read circuit further includes:

an address holding register which stores an address of the actual data at which the parity error is detected; and a backup data storage register which holds the backup data of the actual data in which the parity error is detected.

4. The data recovery circuit according to claim 1, wherein:

the first parity generation circuit writes the actual data to the actual data region based on a first address signal; and the second parity generation circuit writes the backup data to the at least one copy region based on a second address signal that differs from the first address signal.

5. The data recovery circuit according to claim 4, wherein the write circuit further includes:

an address generation circuit which generates the second address signal based on the first address signal so that the actual data is sequentially written to the actual data region from a lower rank address of the actual data region and the backup data is sequentially written to the copy region from an upper rank address of the copy region.

6. The data recovery circuit according to claim 1, wherein:

the at least one copy region includes a first copy region and a second copy region;

the second parity generation circuit writes the backup data with odd parity to the first copy region and the second copy region in parallel; and the read circuit further includes a selection unit which selects either one of the backup data read from the first copy region and the backup data read from the second copy region.

7. The data recovery circuit according to claim 6, wherein:

the first parity generation circuit writes the actual data to the actual data region based on a first address signal; and the second parity generation circuit writes the backup data to the first copy region and the second copy region based on a second address signal that differs from the first address signal.

8. The data recovery circuit according to claim 6, wherein the read circuit further includes:

an address holding register which stores an address of the actual data at which the parity error is detected; and a backup data storage register which holds backup data of the actual data in which the parity error is detected.

9. The data recovery circuit according to claim 1, wherein the read circuit further includes:

a replacement circuit which replaces the actual data in which the parity error is detected with the backup data.

10. The data recovery circuit according to claim 9, wherein the read circuit further includes:

a backup data storage register which holds backup data of the actual data in which the parity error is detected; and a backup address holding register which holds an address of the backup data.

11. A method for generating backup data of actual data with a plurality of memory regions, the method comprising:

writing the actual data with even parity to an actual data region defined by one of the plurality of memory regions;

writing the backup data with odd parity or any other actual data with even parity to at least one copy region defined by at least another one of the plurality of memory regions;

reading data from the actual data region and the at least one copy region;

detecting a parity error in the actual data based on the data read from the actual data region; and checking whether the data read from the at least one copy region is the backup data.

12. The method according to claim 11, further comprising:

storing an address of the actual data at which the parity error is detected; and holding backup data of the actual data in which the parity error is detected.

13. The method according to claim 11, wherein:

said writing the actual data includes writing the actual data to the actual data region based on a first address signal; and said writing the backup data includes writing the backup data to the at least one copy region based on a second address signal that differs from the first address signal.

14. The method according to claim 11, wherein:

the at least one copy region includes a first copy region and a second copy region; and said writing the backup data includes writing the backup data with even parity to the first copy region and the second copy region in parallel;

the method further comprising:

selecting either one of the backup data read from the first copy region and the backup data read from the second copy region.

15. The method according to claim 11, further comprising:

replacing the actual data in which the parity error is detected with the backup data.

16. The method according to claim 15, further comprising:

holding backup data of the actual data in which the parity error has been detected; and holding an address of the backup data.

* * * * *